United States Patent [19]
Jordan et al.

[11] Patent Number: 5,486,980
[45] Date of Patent: Jan. 23, 1996

[54] METHOD AND APPARATUS FOR DISSIPATING THERMAL ENERGY

[75] Inventors: William D. Jordan; Howard G. Hinshaw, both of Dallas, Tex.

[73] Assignee: Thermalloy, Inc., Dallas, Tex.

[21] Appl. No.: 302,336

[22] Filed: Sep. 8, 1994

Related U.S. Application Data

[63] Continuation-in-part of Ser. No. 39,955, Mar. 30, 1993, abandoned.

[51] Int. Cl.$^6$ ................................................... H05K 7/20
[52] U.S. Cl. ........................ 361/697; 165/80.3; 165/121; 165/185; 257/722
[58] Field of Search ..................... 165/80.3, 121, 165/185; 174/16.3; 361/694, 695, 697, 707, 709, 710; 257/722

[56] References Cited

U.S. PATENT DOCUMENTS

| | | | |
|---|---|---|---|
| 3,303,392 | 2/1967 | Zelina | 361/710 |
| 4,277,816 | 7/1981 | Dunn et al. | 361/384 |
| 4,459,638 | 7/1984 | Brehm et al. | 361/697 |
| 4,557,225 | 12/1985 | Sagues et al. | 165/80.3 X |
| 4,790,373 | 12/1988 | Raynor et al. | 165/185 |
| 4,823,869 | 4/1989 | Arnold et al. | 165/185 |
| 4,884,331 | 12/1989 | Hinshaw | 29/558 |
| 5,304,846 | 4/1994 | Azar et al. | 257/722 |
| 5,309,983 | 5/1994 | Bailey | 165/80.3 |

OTHER PUBLICATIONS

"Thermal Management: Cooling Microprossors", Special Supplement to Electronic Packaging & Production, Jul. 1992.
Reprint from Thermalloy 1991 Catalog; Plastic Power Heat Sinks; Extruded Power Heat Sinks.

*Primary Examiner*—Allen J. Flanigan
*Attorney, Agent, or Firm*—Jack A. Kanz

[57] ABSTRACT

Heat sink apparatus for cooling large electronic devices is formed with a heat sink body having a plurality of pins extending outwardly from the base of the heat sink body and a rotary fan having a blowing surface mounted adjacent the outer extremity of the pins. The pins are separated by intersecting grooves providing a large surface area for the heat sink body. The surface area of the heat sink body is sufficiently large to provide a thermal impedance of substantially less than 1.0° C./W and the volume occupied by the heat sink is sufficiently small to provide a volume performance value of less than about 6° C. in$^3$/W.

14 Claims, 3 Drawing Sheets

METHOD AND APPARATUS FOR DISSIPATING THERMAL ENERGY

This is a continuation-in-part of application Ser. No. 08/039,955 filed Mar. 30, 1993, entitled Method and Apparatus for Dissipating Thermal Energy, now abandoned.

This invention relates to dissipation of thermal energy generated by electronic devices. More particularly, it relates to miniaturized heat sink apparatus for dissipating thermal energy generated by large semiconductor devices and the like into the surrounding environment and to methods of using such apparatus.

Many electronic devices used in electrical systems such as power controls, traction drives, variable speed motor controls, microprocessors and the like generate heat during operation which must be dissipated to avoid damage to the electronic device. Some such devices have power-handling limitations which are largely determined by their ability to expel internally-generated heat and thereby avoid general or localized thermal degradations or failures within them. Apparatus for removing and dissipating such excess thermal energy (generally referred to as "heat sinks") are thus necessary to the operation of such systems.

U.S. Pat. No. 4,884,331 to Hinshaw describes heat sinks which have been successfully used for relatively small semiconductor device packages. These heat sinks are generally quite small and are primarily designed for computer applications. Fans have been used in conjunction with such heat sinks to form miniature thermal cooling modules. These small thermal cooling modules (TCMs) have been found to exhibit thermal impedance values in the range of about 1.0° C./W. Such modules, however, are much too limited for use in large power controls and the like. Large systems such as traction drives, variable speed motor controls and the like employ high power semiconductor devices such as insulated gate bipolar transistors (IGBTs) or similar devices and require heat dissipating apparatus which exhibits thermal impedance values of less than about 0.3° C./W to achieve acceptable energy dissipation in a reasonably-sized control system. To achieve such thermal impedance values, forced convection cooling units such as those supplied by Alutronic, 5884 Halver, Auf der Lobke 9–11, Postfach 12 03, Germany, have been extensively used. Similar apparatus is produced by Aavid Engineering, Inc. of Laconia, N.H. Such prior art apparatus generally comprises a plurality of thin parallel fins longitudinally bonded within a rectangular housing. The housing may also comprise a compression chamber for reducing air into the fin section in order to provide a uniform flow of air through the fins. However, in order to provide a cooling structure which exhibits a thermal impedance value of substantially less than 1° C./W, these devices require a heat sink of extremely large volume. For example, a typical forced convection cooler for IGBTs and the like is the model LK40-200Q apparatus sold by Alutronic. This apparatus exhibits a thermal impedance value of about 0.044° C./W but occupies a volume of about two hundred six (206) cubic inches. It will be recognized that the term "thermal impedance" is used herein in the ordinary sense to quantify cooling apparatus in terms of temperature rise per unit of heat transfer (or power dissipation) expressed in units of degrees Centigrade per watt. It has long been industry practice to rate the thermal impedance (or "thermal resistance") under natural convection at a specified temperature. Thermal impedance, of course, decreases under forced convection conditions. However, the rate of decrease is not linear and usually becomes insignificant when ambient air velocity exceeds about 800–1000 feet per minute. According, absent other controlling conditions, when individual fans are used to provide forced convection for a heat sink, the fan capacity is ordinarily selected to provide an ambient air velocity of about 400 feet per minute or more.

As applications of heavy duty power control systems and the like expand, it is desirable that the space required by the systems which cool the power devices be reduced. Unfortunately, the lowest volume performance value (determined by multiplying volume times thermal impedance and expressed as $R_o V$) for forced air cooling apparatus has not heretofore been lower than about 6.0° C. in$^3$/W.

It has now been discovered that forced cooling heat sinks made in accordance with the invention can achieve volume performance values substantially lower than 6.0° C. in$^3$/W. Such heat sink apparatus is produced by providing a thermally conductive base which has one face adapted to be attached in thermal communication with the device to be cooled and having a plurality of substantially parallel pins extending from another face thereof. The surface area of the pins must be sufficient to provide a thermal impedance of substantially less than about 1.0° C./W (preferably less than about 0.3° C./W) when cooled with air forced substantially axially with respect to the pins and toward the base at an average velocity of at least about 400 feet per minute. When the pins are properly spaced, the dimensions of the space occupied by the heat sink body and pins is reduced sufficiently to form a heat sink body having a thermal impedance value ($R_o$) of less than about 0.3° C./W and a volume performance value ($R_o V$) of less than about 6.0° C. in$^3$/W.

In accordance with the present invention, heat sinks for removing and dissipating heat from large electronic devices are provided which include a heat sink body to be attached in contact with an electronic device package. The heat sink body has parallel pins extending outwardly from the body with the pins separated by intersecting grooves. A rotary fan is mounted for forcing air through the grooves between the pins and toward the base. Thermal energy dissipation is so effective that the thermal impedance of the heat sink is substantially less than 1.0° C./W using heat sink assemblies which have an overall volume of less then one-third that normally employed. Other features and advantages of the invention will become more readily understood from the following detailed description taken in connection with the appended claims and attached drawing in which:

Figure 1:
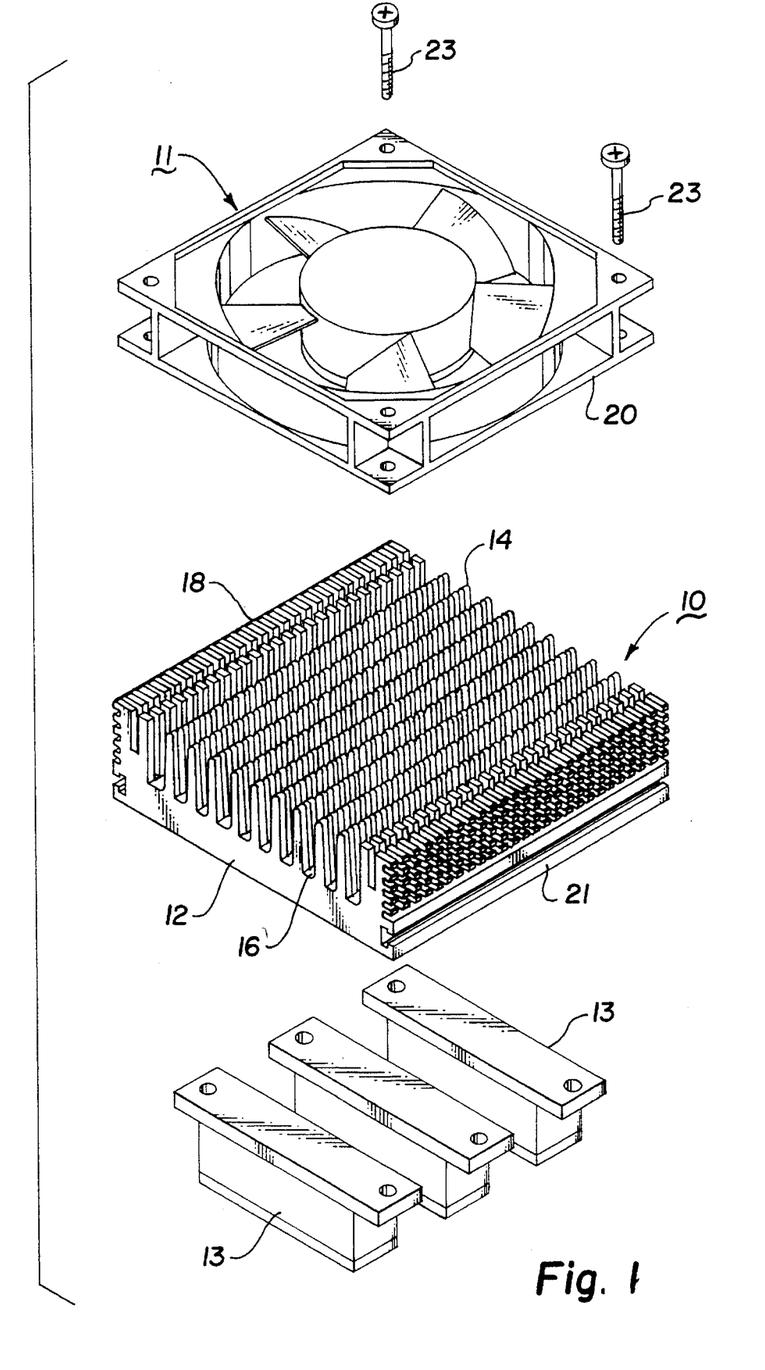
FIG. 1 is an exploded view of heat sink apparatus in accordance with the presently preferred embodiment of the invention.

Heat sink apparatus in accordance with the presently preferred embodiment of the invention is shown in FIG. 1. For clarity of illustration, like reference numerals designate like or corresponding elements throughout the several views of the drawing. The embodiment illustrated comprises heat sink body 10 and rotary fan 11 shown in perspective view with a plurality of electronic devices such as insulated gate bipolar transistors (IGBTs) 13. It will be recognized that the IGBT package is used herein merely as illustrative of the general type of electronic devices which require highly effective heat sinks to operate efficiently. Various other devices such as power transistors and the like have similar requirements and are equally benefited by the invention.

Figure 2:
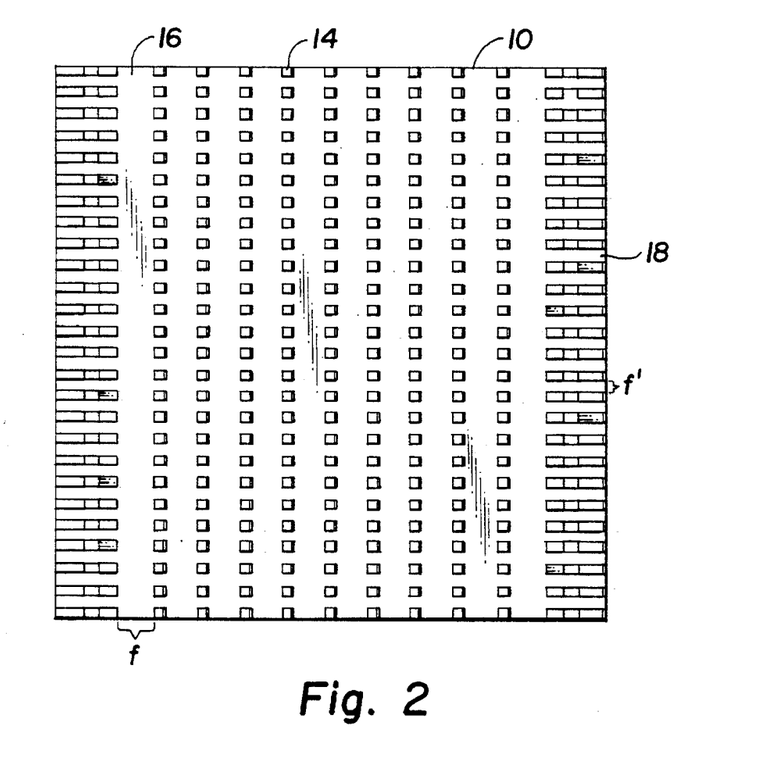
FIG. 2 is a top plan view of a preferred embodiment of a heat sink body in accordance with the present invention.
Figure 3:
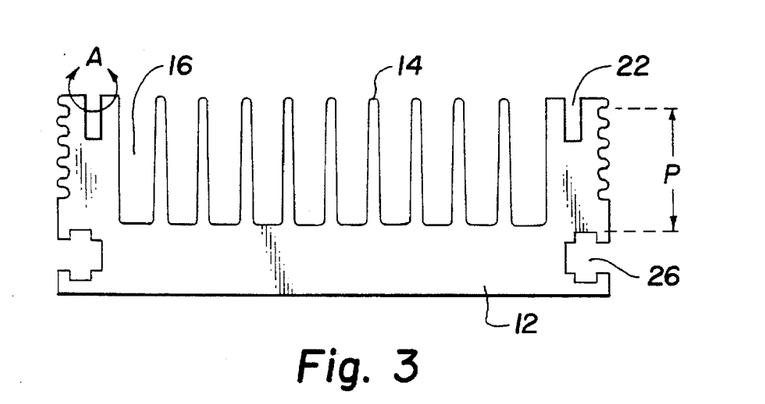
FIG. 3 is a side elevational view of the heat sink body of FIG. 2.

As shown in FIGS. 1–3, heat sink body 10 comprises a base 12 with a predetermined number of parallel pins 14 extending outwardly from the top surface of base 12. Heat sink body 10 is preferably constructed from material having a relatively high coefficient of thermal conductivity such as aluminum, aluminum alloys, copper, copper alloys or the like. Pins 14 are separated by parallel longitudinal grooves 16 and parallel lateral grooves 18 in intersecting relation to each other. Pins 14 extend outwardly a predetermined distance or height p from the top surface of base 12 and at a predetermined angle from base 12. In the preferred embodiments, the predetermined angle is approximately ninety degrees. Longitudinal grooves 16 are of predetermined width f and lateral grooves 18 are of a predetermined with f' as measured Between adjacent parallel pins 14 These widths, f and f' may be the same or different. In the embodiment shown, width f is greater than width f'. As will be appreciated, the depth of grooves 16 and 18 is equal to the height p of pins 14.

Heat sink body 10 may be fabricated by various processes. For example, the body 10 may be formed by an extrusion process wherein the base is formed with parallel fins extending in the longitudinal direction and separated by longitudinal grooves 16. The body 10 may then be sawed in single passes or gang sawed along the lateral direction of body 10 forming a plurality of lateral grooves 18 and leaving parallel spaced pins 14 between the grooves 16 and 18. In this embodiment the height p of the pins is limited to the fin and groove formation limitations of the extrusion process.

In an alternative process a block of the preferred material for heat sink body 10 is provided and the required number of longitudinal grooves 16 and lateral grooves 18 of desired widths f and f' formed by sawing or machining in single passes or gang sawing. When formed by machining or sawing the height p of the pins is not limited by an extrusion process. Regardless of the process of fabrication, heat sink body 10 may be anodized or otherwise treated for protection against corrosion and to enhance the heat dissipation characteristics thereof.

The configuration of the heat sink body in six test parts is summarized in Table 1.

TABLE 1

| Test No. | Width (Inches) | Length (Inches) | Height (Inches) | Fan Diameter (Inches) |
|---|---|---|---|---|
| EX-2451 | 4.75 | 4.85 | 1.75 | 4.5 |
| EX-2452 | 4.75 | 7.13 | 1.75 | 4.5 |
| EX-2453 | 4.75 | 9.60 | 1.75 | 4.5 |
| EX-2461 | 6.95 | 6.94 | 1.75 | 5.75 |
| EX-2462 | 6.95 | 10.36 | 1.75 | 5.75 |
| EX-2463 | 13.90 | 10.36 | 1.75 | 5.75* |

* includes two fans mounted side-by-side.

Six experimental embodiments of the invention were fabricated for test purposes. In the first embodiment of the invention (identified as EX-2451 in Table 1) the length of the base 12 of body 10 is 4.85 inches (12.3 cm) in the longitudinal direction and 4.75 inches (12.7 cm) in the lateral direction. In the second embodiment (EX-2452) the length of the base 12 of body 10 is 7.13 inches (18.10 cm) in the longitudinal direction and 4.75 inches (12.07 cm) in the lateral direction. In the third embodiment (EX-2453) the length of the base 12 of body 10 is 9.60 inches (24.37 cm) in the longitudinal direction and 4.75 (12.07 cm) in the lateral direction. In each of these three embodiments, the height p of the pins 14 is 1.1 inches (2.79 cm), the width f of longitudinal grooves 16 is 0.30 inches (0.77 cm) and the width f' of lateral grooves 18 is 0.10 inches (0.24 cm).

In the fourth embodiment of the present invention (EX-2461) the length of the base 12 of body 10 is 6.94 inches (17.61 cm) in the longitudinal direction and 6.95 inches (17.65 cm) in the lateral direction. In the fifth embodiment (EX-2462) the length of the base 12 of body 10 is 10.36 inches (26.30 cm) in the longitudinal direction and 6.95 inches (17.65 cm) in the lateral direction. In the sixth embodiment (EX-2463) the length of the base 12 is 10.36 inches (26.30 cm) in the longitudinal direction and 13.90 inches (35.29 cm) in the lateral direction. In each of he fourth, fifth and sixth embodiments, the height p of the pins 14 is 1.1 inches (2.79 cm), the width f of longitudinal grooves 16 is 0.28 inches (0.72 cm) and the width f' of lateral grooves 18 is 0.10 inches (0.24 cm).

Referring once again to FIG. 1, rotary fan 11 is mounted to provide a flow of air through the grooves 16 and 18 of heat sink body 10. Rotary fan 11 is disposed with its blowing surface 20 mounted for impingement cooling of the heat sink body. For impingement cooling, the fan 11 is mounted to direct air substantially toward the base or surface of the heat sink body from which the pins extend. In the embodiment shown, rotary fan 11 is mechanically affixed to heat sink body 10 with screws 23 and aligned to deliver air axially with respect to the pins 14 centrally located on the face of the heat sink body which is opposite attachment surface 21. In this manner the cooling air impinges on all surfaces of the pins 14 and is conducted outwardly through grooves 16 and 18. It will be readily recognized, however, that other fan arrangements may be utilized.

Figure 4:
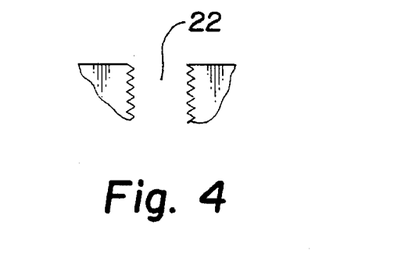
FIG. 4 is a cutaway view of a screw slot in the heat sink body of the presently preferred embodiment of the invention.

Referring to FIGS. 2 and 3, the pins 14 in the two outermost rows aligned along the longitudinal axis of base 12 are provided with screw threads forming screw slots 22. Screw slots 22 are shown enlarged in the cutaway view of section A in FIG. 4. In the embodiment illustrated, rotary fan 11 is mounted at the outer extremity of pins 14 with bolts or screws 23 passing through the four corners of the housing of the rotary fan 11 and screwed in to screw slots 22. Various other means may be used to mount the fan on the heat sink body. In fact, the fan 12 may be spaced from but supported very near the ends of the pins 14 by securing the fan to other supporting structure without departing from the principles of the invention.

Figure 5:
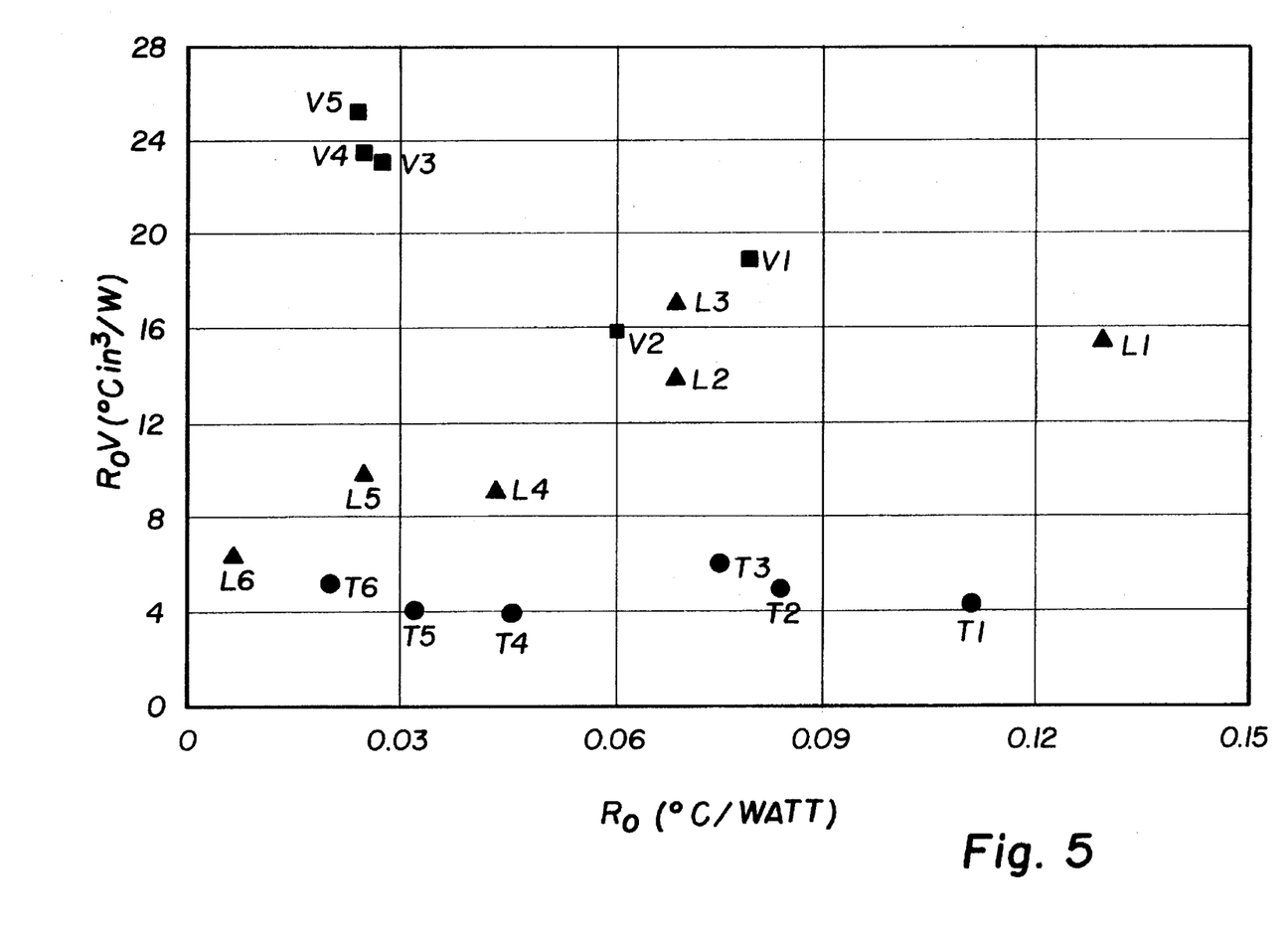
FIG. 5 is a graphic display of comparative values of $R_o V$ for commercial prior art apparatus and for test apparatus made in accordance with the invention.

Table 2 provides a comparison between the six devices described above and typical commercial prior art devices. As shown in Table 2 and FIG. 5, heat sink apparatus constructed in accordance with the present invention not only exhibit values of thermal impedance which are significantly lower than conventional apparatus, the smaller physical envelope of the device provides a volume performance value ($R_o V$) significantly lower than achieved by the prior art.

TABLE 2

| | Data Point | Model | $R_o$ (°C./W) | Volume (in) | $R_o V$ (°C. in$^3$/W) |
|---|---|---|---|---|---|
| Alutronic | L1 | LK10-100A | .13 | 119 | 15.5 |
| | L2 | LK20-200A | .07 | 198 | 13.9 |
| | L3 | LK30-200A | .07 | 241 | 16.9 |
| | L4 | LK40-200Q | .044 | 206 | 9.1 |
| | L5 | LK60-200R | .025 | 390 | 9.8 |
| | L6 | LK60-500R | .0064 | 975 | 6.2 |
| Aavid | V1 | 476200 | .08 | 238 | 19.0 |

TABLE 2-continued

|  | Data Point | Model | $R_o$ (°C./W) | Volume (in) | $R_oV$ (°C. in³/W) |
|---|---|---|---|---|---|
|  | V2 | 476300 | .06 | 264 | 15.8 |
|  | V3 | 476400 | .028 | 825 | 23.1 |
|  | V4 | 476500 | .025 | 939 | 23.5 |
|  | V5 | 476600 | .024 | 1,052 | 25.2 |
| Test Part | T1 | EX-2451 | .111 | 40 | 4.4 |
|  | T2 | EX-2452 | .084 | 60 | 5.0 |
|  | T3 | EX-2453 | .075 | 79 | 5.9 |
|  | T4 | EX-2461 | .046 | 84 | 3.9 |
|  | T5 | EX-2462 | .032 | 128 | 4.1 |
|  | T6 | EX-2463 | .020 | 256 | 5.1 |

In Table 2 the characteristics of six (6) products made by Alutronic and five (5) products made by Aavid are compared to the six (6) experimental devices of Table 1. The $R_oV$ values are plotted graphically in FIG. 5. It will be immediately recognized that all the experimental devices exhibit $R_oV$ values less than 6.0° C. in³/W while none of the prior art devices exhibit $R_oV$ values less than 6.0° C. in³/W. Furthermore, it should be noted that the volume figures used in Table 2 include only the heat sink body and do not include the volume occupied by the fan. In accordance with the invention, the fan is preferably a flat rotary fan which directs air toward the heat sink for impingement cooling. Thus the fan 11 occupies much less space than the large squirrel-cage fans currently used in the prior art apparatus. Furthermore, impingement cooling by directing the air over pins 14 breaks up boundary layers and provides more efficient transfer of thermal energy from the pins to the cooling air.

As illustrated in FIG. 1, a plurality of electronic devices such as IGBTs 13 may be affixed to the surface 21 of base 12 opposite the pins 14. The devices may be secured to the surface of heat sink body 10 by any conventional method such as with screws, bolts or adhesives. Alternatively, slots or holes may be formed in surface 21 for mounting the device package or the device package 13 may be simply clamped in place.

As shown in FIG. 3, heat sink body 10 is provided with mounting grooves 26 for securing the heat sink apparatus to a cabinet or the like. In the embodiment shown, mounting grooves 26 are cross-shaped to receive a similar cross-shaped protrusion in a cabinet or the like as heat sink body 10 is slid into the cabinet. Various other supporting techniques can be used.

Although particular embodiments of the present invention have been described and illustrated herein, it is to be recognized that modifications and variations may readily occur to those skilled in the art without departing from the spirit and scope of the invention. Consequently, it is intended that the claims be intended to cover such modifications and equivalents.

What is claimed is:

1. Heat sink apparatus comprising:
   (a) a thermally conductive body including a base having a face adapted for attachment to an electronic device package; and
   (b) a plurality of substantially parallel pins extending from said base exhibiting sufficient surface area to provide a thermal impedance of less than about 0.3° C./W when air at an average velocity of at least about 400 feet per minute impinges on the heat sink in a direction substantially parallel with said pins; said body and pins having maximum dimensions defining a volume which produces a volume performance value of less than about 6° C. in³/W.

2. Heat sink apparatus as defined in claim 1 wherein said pins are aligned in parallel rows and separated by two sets of intersecting grooves.

3. Heat sink apparatus as defined in claim 2 wherein said grooves intersect at approximately 90°.

4. Heat sink apparatus as defined in claim 2 wherein a majority of said pins are substantially parallel and have one end joined to said base and the opposite end lying in a plane displaced from said base.

5. Heat sink apparatus as defined in claim 4 and including a fan for directing air toward the base in a direction substantially normal to said plane displaced from said base.

6. Heat sink apparatus as defined in claim 1 wherein said body and said pins form a unitary body.

7. Heat sink apparatus for attachment to an electronic device package comprising:
   (a) a heat sink body to be attached in contact with an electronic device package, said heat sink body comprising a base having a bottom surface and a top surface with parallel pins extending outwardly from said top surface of said base with said pins separated by two sets of intersecting grooves; and
   (b) a fan mounted at the outward extremity of said pins for forcing air through said grooves toward said base at an average velocity of at least about 400 feet per minute, the surface area of said heat sink body being sufficiently large to produce a thermal impedance of less than about 0.3° C./W under impingement cooling by said fan.

8. Heat sink apparatus as defined in claim 7 wherein said fan is a rotary fan defining a blowing surface which approximately matches the surface area of said bottom surface of said base.

9. Heat sink apparatus as defined in claim 7 further comprising an insulated gate bipolar transistor affixed to said bottom surface.

10. Heat sink apparatus as defined in claim 7 wherein said base includes means for mounting said heat sink apparatus on a supporting structure.

11. Heat sink apparatus as defined in claim 11 wherein said means for mounting comprises cross-shaped grooves adapted to receive a mating cross-shaped protrusion in a cabinet.

12. Heat sink apparatus as defined in claim 7 wherein the outermost grooves in said heat sink body have screw slots aligned with holes in the housing supporting said rotary fan and bolts extending through said holes into said screw slots to affix said heat sink body to said fan.

13. In combination:
   (a) a heat sink comprising:
      (i) a thermally conductive body including a base having a face adapted for attachment to an electronic device package; and
      (ii) a plurality of substantially parallel pins extending from said base exhibiting sufficient surface area to provide a thermal impedance of less than about 0.3° C./W when air at an average velocity of at least about 400 feet per minute impinges thereon in a direction substantially parallel with said pins; said body and pins having maximum dimensions defining a volume which produces a volume performance value of less than about 6° C. in³/W;
   (b) an electronic device package in thermal communication with said face adapted for attachment; and
   (c) a fan adapted to force air between said pins in a direction toward the base from which the pins extend at an average velocity of at least about 400 feet per minute.

14. The method of dissipating heat from an electronic device package comprising the steps of:
   (a) affixing an electronic device package adjacent and in thermal communication with a thermally conductive body having a base and a plurality of substantially parallel pins extending from said base exhibiting sufficient surface area to provide a thermal impedance of less than about 0.3° C./W when air at an average velocity of at least about 400 feet per minute impinges on said body in a direction substantially parallel with said pins and having maximum dimensions defining a volume which provides a volume performance value of less than about 6° C. in$^3$/W; and
   (b) directing air toward said base in a direction substantially parallel with pins extending from said base at an average velocity of at least about 400 feet per minute.

* * * * *

UNITED STATES PATENT AND TRADEMARK OFFICE
CERTIFICATE OF CORRECTION

PATENT NO. : 5,486,980          Page 1 of 3
DATED : January 23, 1996
INVENTOR(S) : William D. Jordan, et al.

It is certified that error appears in the above-indentified patent and that said Letters Patent is hereby corrected as shown below:

IN THE ABSTRACT

Line 9, "1.0° C./W" should read ---1.0° C/W---.

Line 11, "6° C. in$^3$/W." should read ---6°C in$^3$/W.---.

Col. 1, line 24, "U.S. Pat." should read ---United States Letters Patent---.

Col. 1, line 31, "1.0° C./W." should read ---1.0° C/W.---.

Col. 1, line 38, "0.3° C./W" should read ---0.3° C/W---.

Col. 1, line 44, "N.H." should read ---New Hampshire---.

Col. 1, line 51, "1°C./W," should read --1°C/W,--.

Col. 1, line 56, "0.044° C./W" should read ---0.044° C/W---.

Col. 2, lines 12 and 15, "6.0°C. in$^3$/W." should read --6.0°C in$^3$/W.--.

Col. 2, line 19, "Substantially" should read ---substantially---.

Col. 2, line 22, "1.0° C./W" should read ---1.0° C/W---.

Col. 2, lines 23 and 29, "0.3° C./W" should read ---0.3° C/W---.

Col. 2, line 30, "6.0°C.in$^3$/W." should read --6.0°C in3/W.--.

UNITED STATES PATENT AND TRADEMARK OFFICE
CERTIFICATE OF CORRECTION

PATENT NO. : 5,486,980  Page 2 of 3
DATED : Janaury 23, 1996
INVENTOR(S) : William D. Jordan, et al.

It is certified that error appears in the above-indentified patent and that said Letters Patent is hereby corrected as shown below:

Col. 2, line 40, "1.0° C./W" should read ---1.0° C/W---.

Col. 3, line 5, "FIGS." should read ---Fig.s---.

Col. 3, line 19, "Between" should read ---between---.

Col. 3, line 19, "pins 14" should read ---pins 14.---.

Col. 3, line 20, "f and f'" should read ---f and f',---.

Col. 4, line 15, "he" should read ---the---.

Col. 4, line 35, "FIGS." should read ---Fig.s---.

IN TABLE 2

Col. 4, line 60, "°C./W" should read ---°C/W---.
Col. 4, line 60, "°C. in³/W" should read ---°C in³/W---.

Col. 5, line 4, "°C./W" should read ---°C/W---.
Col. 5, line 4, "°C. in³/W" should read ---°C in³/W---.
Col. 5, line 21 "6.0°C.in³/W" should read --6.0°C in³/W--.

Col. 5, line 22, "6.0°C.in³/W." should read --6.0°C in³/W.--.

Col. 5, line 62, "0.3° C./W" should read ---0.3° C/W---.

UNITED STATES PATENT AND TRADEMARK OFFICE
CERTIFICATE OF CORRECTION

PATENT NO. : 5,486,980
DATED : January 23, 1996
INVENTOR(S) : William D. Jordan, et al.

It is certified that error appears in the above-identified patent and that said Letters Patent is hereby corrected as shown below:

Col. 5, line 68, "6° C. in³/W." should read ---6°C in³/W.---.

Col. 6, line 28, "0.3° C./W" should read ---0.3° C/W---.

Col. 6, line 55, "0.3° C./W" should read ---0.3° C/W---.

Col. 6, line 60, "6° C. in³/W;" should read ---6°C in³/W;---.

Col. 7, line 8, "0.3° C./W" should read ---0.3° C/W---.

Col. 8, line 4, "6° C. in³/W;" should read ---6°C in³/W;---.

Signed and Sealed this

Fourteenth Day of May, 1996

Attest:

BRUCE LEHMAN

*Attesting Officer*     *Commissioner of Patents and Trademarks*